US008256110B2

(12) United States Patent
Ju

(10) Patent No.: US 8,256,110 B2
(45) Date of Patent: Sep. 4, 2012

(54) METHOD OF MANUFACTURING ELECTRICAL CONNECTOR

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 1062 days.

(21) Appl. No.: 12/052,834

(22) Filed: Mar. 21, 2008

(65) Prior Publication Data

US 2009/0025218 A1 Jan. 29, 2009

(30) Foreign Application Priority Data

Jul. 26, 2007 (CN) .......................... 2007 1 0029381

(51) Int. Cl.
*H01R 9/00* (2006.01)
*H05K 3/00* (2006.01)

(52) U.S. Cl. ................. 29/842; 29/830; 29/849; 29/850

(58) Field of Classification Search .................... 29/842, 29/830–832, 848, 850, 889, DIG. 29, 849; 439/66, 70, 71, 567, 607.05, 607.11, 931
See application file for complete search history.

(56) References Cited

U.S. PATENT DOCUMENTS 6,516,513 B2 * 2/2003 Milkovich et al. .............. 29/830
6,561,819 B1 * 5/2003 Huang et al. .................... 439/66
6,877,992 B2 * 4/2005 Grant et al. ..................... 439/66
7,329,150 B2 * 2/2008 Ju ............................ 439/607.11

* cited by examiner

*Primary Examiner* — Thiem Phan
(74) *Attorney, Agent, or Firm* — Rosenberg, Klein & Lee

(57) ABSTRACT

The invention provides a method of manufacturing an electronic connector including the steps of: (a) providing an insulating body made of a fiberboard having a thermal deformation degree which is close to the printed circuit board, and a plurality of terminal receiving apertures penetrating a top surface and a under surface of the insulating body being deposed on the insulating body; (b) forming a plurality of conducting terminals respectively comprising a soldering portion soldering to the printed circuit board and a contacting arm electrically contacting with an electronic device; and (c) setting the conducting terminals into the insulating body. In the method of manufacturing an electronic connector according to the invention, because the thermal deformation degrees of the materials used in the insulating body and the printed circuit board are substantially same, a false soldering phenomenon between the conducting terminals located at four corners of the insulating body and the printed circuit board can be prevented.

6 Claims, 3 Drawing Sheets

METHOD OF MANUFACTURING ELECTRICAL CONNECTOR

CROSS REFERENCE TO RELATED DOCUMENTS

This application claims benefit of CHINA Patent Application No. 2007 10029381.6, filed on Jul. 4, 2007.

BACKGROUND OF THE INVENTION

1. Field of the Invention

The invention relates to a method of manufacturing an electrical connector.

2. Description of the Prior Art

As shown in FIG. 1, a conventional electrical connector 1' disposed on a printed circuit board 2' is used for electrically connecting a chip module to the printed circuit board 2'. The electrical connector 1' includes an insulating body 10' and a plurality of conducting terminals 20' disposed in the insulating body 10'. The insulating body 10' therein has a plurality of terminal receiving apertures 100' penetrating through a top surface and a bottom surface of the insulating body 10'. The conducting terminals 20' are respectively disposed in the terminal receiving apertures 100' and each conducting terminal includes a middle portion 200', a conducting portion 201' in a cantilever form and extending upward from the middle portion 200', and a soldering portion 202' extending downward from the middle portion 200'.

Generally, in the process of manufacturing the electrical connector, liquid crystal polymer is chosen as a material of the insulating body 10', and fiber-benzene-resin is chosen as a material of the printed circuit board 2'. After being heated, the four corners of the insulating body 10' will bend upward; the four corners of the printed circuit board 2' will also bend upward. But as shown in FIG. 2, their warping degrees are different. The warping degree of the four corners of the insulating body 10' is larger than that of the printed circuit board. Thus, the gap between the insulating body 10' and the printed circuit board 2' near the four corners is evidently larger than that at the middle part of the insulating body 10'.

Moreover, a height that the conducting terminal 20' near the four corners extends from the insulating body 10' is the same as the height that the conducting terminal 20' located at the middle part of the insulating body 10' extends from the insulating body 10'. And, when the insulating body 10' is heated and the four corners of the insulating body 10' bend upward, the corresponding conducting terminals 20' located at the four corners will also move upward. Thus, the distance between the conducting terminals 20' and the printed circuit board 2' near the four corners will be larger than that at the middle part of the insulating body 10'. According to the preceding description, we can know that, when the conducting terminals 20' located at the middle part of the insulating body 10' are soldered on the printed circuit board 2', the conducting terminals 20' located at the four corners won't be soldered with the printed circuit board 2'.

Therefore, a novel method of manufacturing the electrical connector is needed to solve the above-mentioned problem.

SUMMARY OF THE INVENTION

A goal of the invention is to provide a method of manufacturing an electrical connector to obtain a good soldering effect between the electrical connector and the printed circuit board.

In order to reach the goal, the method of manufacturing the electrical connector includes the steps of: (a) providing an insulating body made of a fiberboard having a thermal deformation degree close to that of a printed circuit board, and including a plurality of terminal receiving apertures penetrating through a top surface and a bottom surface of the insulating body; (b) forming a plurality of conducting terminals respectively having a soldering portion to be soldered with the printed circuit board and a contacting arm to be electrically contacted an electronic device; and (c) disposing the conducting terminals into the insulating body.

Compared with the prior art, because the thermal deformation degrees of the materials used in the insulating body and in the printed circuit board are substantially same, a false soldering phenomenon between the conducting terminals located at the four corners of the insulating body and the printed circuit board can be prevented. So the electrical conductivity between the electrical connector and the printed circuit board is satisfactory.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
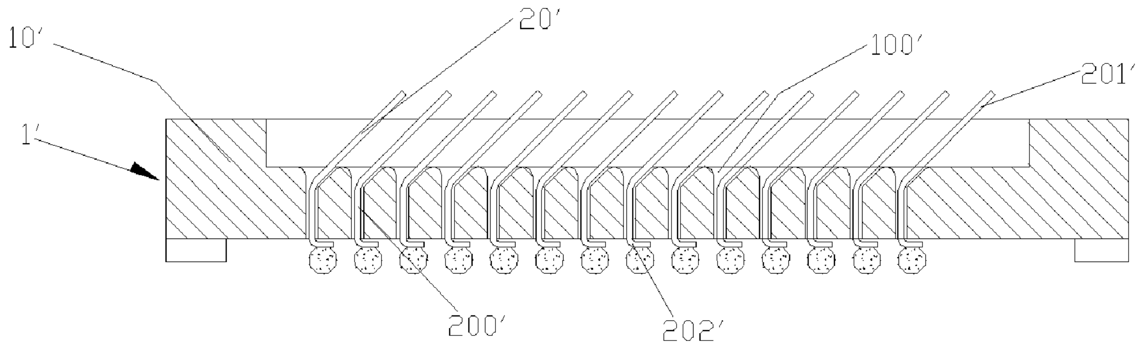
FIG. 1 (Prior art)
FIG. 1 is a diagram of a conventional electrical connector.
Figure 2:
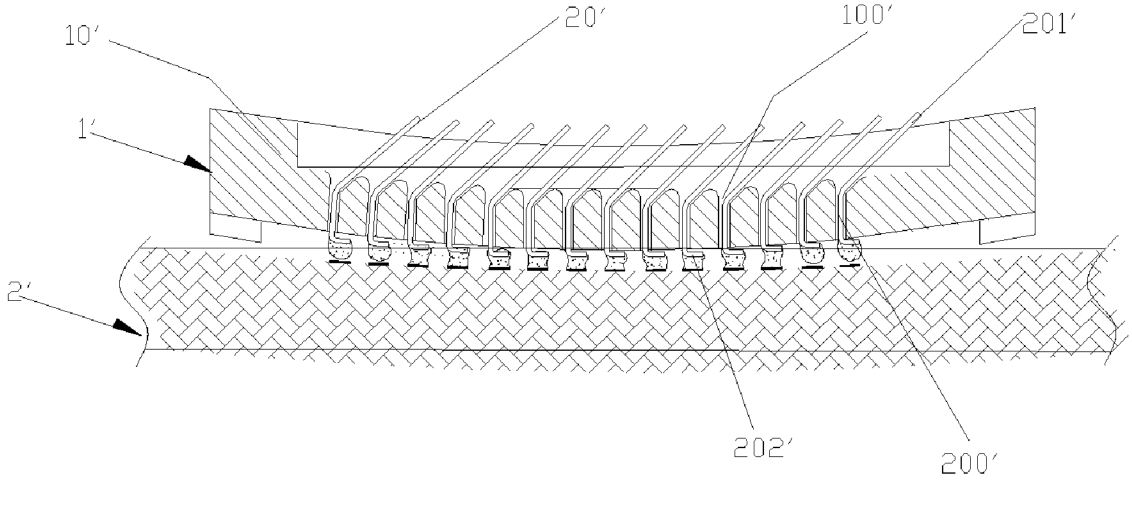
FIG. 2 (Prior art)
FIG. 2 is a diagram of the conventional electrical connector as shown in FIG. 1 and a printed circuit board after being heated.

The method of manufacturing an electrical connector according to the invention will be further explained by the following embodiments together with the appended drawings.

According to the invention, the method of manufacturing an electrical connector includes following steps. First, an insulating body 1 made of a fiberboard having a thermal deformation degree close to that of the printed circuit board 4 is provided. The insulating body 1 therein has a plurality of terminal receiving apertures 10 penetrating through a top surface and a bottom surface of the insulating body 1. And, a metal layer 11 is disposed on the wall of the terminal receiving aperture 10. In addition, holding apertures 12 are respectively formed at four corners of the insulating body 1. Then, a plurality of conducting terminals 2 are punched from a metal slice. The conducting terminal 2 has a soldering portion 22 to be soldered with the printed circuit board 4 and a contacting arm 21 to be electrically contacted an electronic device.

Thereafter, holding members 5 are provided and each holding member 5 comprises a positioning portion 50 formed at a top part thereof, a supporting portion 51 formed at a middle part thereof, a holding portion 52 formed at a bottom part thereof. Then, the conducting terminals 2 are respectively disposed into the terminal receiving apertures 10 of the insulating body 1 from the top surface or the bottom surface of the insulating body 1. Afterward, the holding members 5 are respectively disposed into the holding apertures 12 of the insulating body 1.

Because the thermal deformation degrees of the materials of the insulating body 1 and the printed circuit board 4 in the invention are substantially same, the false soldering phenomenon due to a large difference of warping degrees between them can be prevented.

Figure 3:
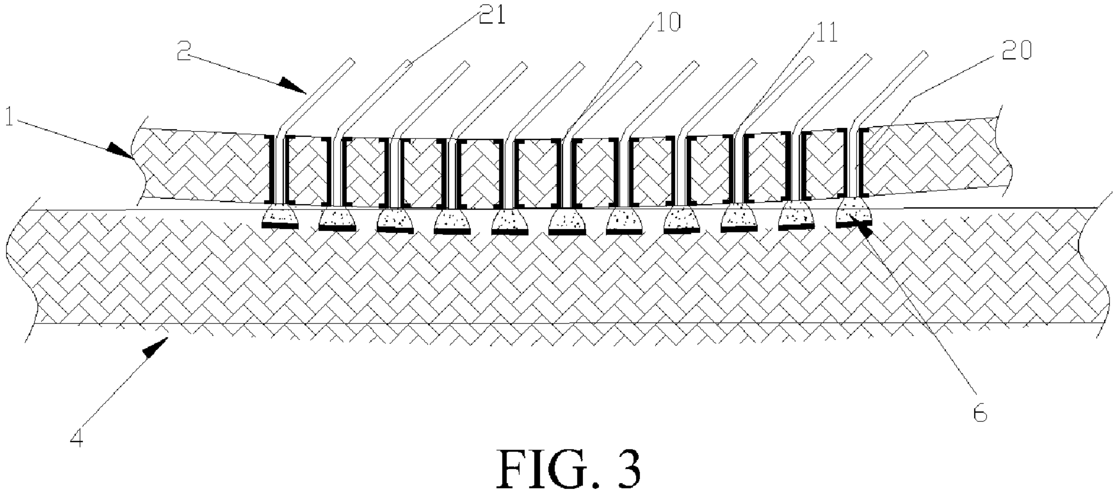
FIG. 3 is a partial cross-sectional diagram of an electrical connector and a printed circuit board after being heated according to the invention.
Figure 4:
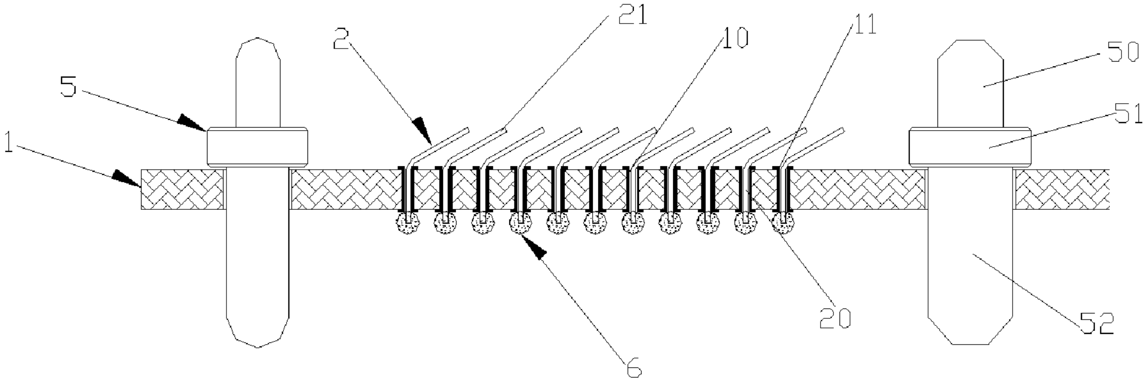
FIG. 4 is a cross-sectional diagram of the electrical connector according to the invention.
Figure 5:
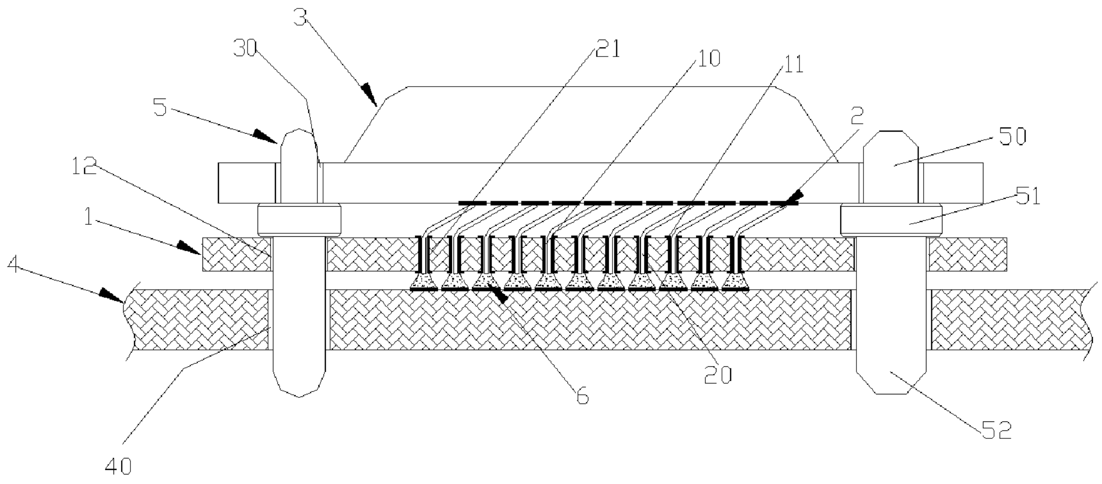
FIG. 5 is a cross-sectional diagram of the electrical connector assembled with the printed circuit board and an electronic device.

As shown in FIG. 3 through FIG. 5, the electrical connector manufactured by the above-mentioned method includes an insulating body 1, a plurality of conducting terminals 2 disposed in the insulating body 1, and holding members 5 used for assembling with an electronic device 3 (a chip module in the embodiment) together with a printed circuit board 4.

The insulating body 1 therein has a plurality of terminal receiving apertures 10 penetrating through a top surface and a bottom surface of the insulating body 1. A metal layer 11 is disposed on the wall of the terminal receiving aperture 10, and the holding apertures 12 penetrating through the insulating body 1 are respectively formed at four corners of the insulating body 1. The conducting terminal 2 includes a middle portion 20 in a straight form, a contacting portion 21 atilt extending upward from the middle portion 20, and a soldering portion 22 extending downward from the middle portion 20.

The positioning apertures 30 corresponding to the holding apertures 12 of the insulating body 1 are disposed at our corners of the electronic device 3. The printed circuit board 4 therein has location apertures 40 corresponding to the holding apertures 12 of the insulating body 1. The holding member 5 is in a cylinder form and includes a positioning portion 50, a supporting portion 51, and a holding portion 52 in a top-to-bottom order. The positioning portion 50 penetrates upward through the positioning aperture 30; the holding portion 52 penetrates downward through the holding apertures 12 and the location aperture 40 in turn.

The supporting portions 51 of the holding members 5 support the electronic device 3 to prevent the electronic device 3 from overpressing the conducting terminals 2. In addition, a plurality of solders 6 between the insulating body 1 and the printed circuit board 4 are respectively disposed on the soldering portions of the conducting terminals 2. As shown in FIG. 5, after the solders 6 are melted, the conducting terminals 2 and the printed circuit board 4 will be soldered together. And, after the solders 6 are melted, parts of the solders 6 will respectively connect with the bottom portions of the metal layers 11 of the terminal receiving apertures 10.

Figure 6:
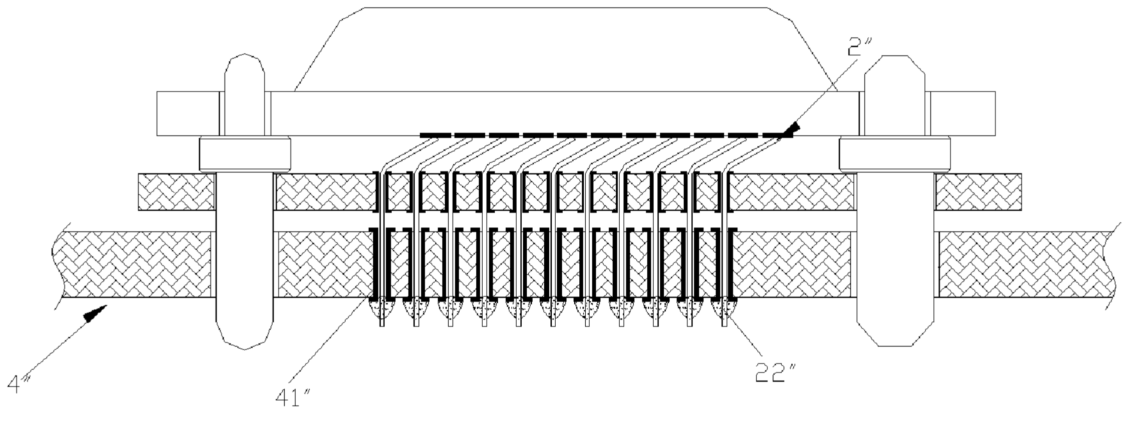
FIG. 6 is a cross-sectional diagram of the electrical connector assembled with the printed circuit board and the electronic device in another embodiment.

FIG. 6 shows another embodiment of the electrical connector manufactured by the above-mentioned method. The difference between these two electrical connectors is that the electrical connector in FIG. 6 is soldered on the printed circuit board 4 by a DIP type soldering method. Namely, soldering portions 22" of conducting terminals 2" respectively penetrate through solder apertures 41" of the printed circuit board 4" to be soldered with the printed circuit board 4".

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of manufacturing an electrical connector for disposing substantially parallel between a printed circuit board and an electronic device to electrically connect the electronic device to the printed circuit board, the method comprising the steps of:

(a) providing an insulating body made of a fiberboard having a thermal deformation degree between a top surface thereof and a bottom surface thereof close to that of the printed circuit board, the insulating body having a plurality of terminal receiving apertures penetrating through the top surface and the bottom surface thereof, wherein a top surface of the insulating body faces the electronic device, and a bottom surface of the insulating body faces the printed circuit board;

(b) forming a plurality of conducting terminals respectively having a soldering portion to be soldered with the printed circuit board and a contacting arm to be electrically contacted the electronic device; and (c) disposing the conducting terminals correspondingly into the terminal receiving apertures of the insulating body.

2. The method of manufacturing an electrical connector as claimed in claim 1, wherein in the step (a), a metal layer is further disposed on the wall of the terminal receiving aperture.

3. The method of manufacturing an electrical connector as claimed in claim 1, wherein in the step (a), at least two holding apertures are further formed on the insulating body.

4. The method of manufacturing an electrical connector as claimed in claim 3, wherein after step (b), at least two holding members are provided, and respectively include a supporting portion for supporting the electronic device.

5. The method of manufacturing an electrical connector as claimed in claim 4, wherein in step (c), the holding members are further disposed in the holding apertures of the insulating body.

6. The method of manufacturing an electrical connector as claimed in claim 4, wherein each of the holding member is provided in a cylinder form and includes a positioning portion, and a holding portion formed between the positioning portion and the supporting portion, wherein the supporting portion has a diameter larger than that of the positioning portion and the supporting portion, wherein the supporting portion is disposed between the top surface of the insulating body and the bottom surface of the electronic device for preventing the contacting portions of the conducting terminals from damaged, wherein the holding portion is disposed in the holding aperture of the insulating body correspondingly.

* * * * *